United States Patent [19]
Tomozawa

[11] Patent Number: 5,185,770
[45] Date of Patent: Feb. 9, 1993

[54] VARIABLE FREQUENCY DIVIDING CIRCUITS

[75] Inventor: Kikuo Tomozawa, Tokyo, Japan

[73] Assignee: Oki Electric Industry Co., Ltd., Tokyo, Japan

[21] Appl. No.: 616,424

[22] Filed: Nov. 21, 1990

[30] Foreign Application Priority Data

Nov. 29, 1989 [JP] Japan .................................. 1-311431

[51] Int. Cl.$^5$ .......................................... H03K 21/00
[52] U.S. Cl. .......................................... 377/47; 377/39
[58] Field of Search .................. 377/28, 39, 47–49, 377/52, 107, 110, 118; 328/15, 16; 307/271; 371/5.1, 5.3

[56] References Cited

U.S. PATENT DOCUMENTS

| | | | |
|---|---|---|---|
| 3,746,891 | 7/1973 | Rowe | 328/15 |
| 3,924,078 | 12/1975 | Bussey | 377/39 |
| 4,079,234 | 3/1978 | Kashio | 377/39 |
| 4,704,723 | 11/1987 | Markland | 377/48 |
| 4,805,199 | 2/1989 | Muramatsu | 377/39 |
| 4,881,040 | 11/1989 | Vaughn | 377/39 |

FOREIGN PATENT DOCUMENTS 0182924 10/1983 Japan ........................................ 377/39

Primary Examiner—William L. Sikes
Assistant Examiner—Tai V. Duong
Attorney, Agent, or Firm—Edward D. Manzo; David K. Lucente

[57] ABSTRACT

A variable frequency dividing circuit according to this invention switches a frequency division ratio immediately after a neew frequency division ratio has been input, and then performs a frequency dividing operation without discarding already counted values. This frequency dividing circuit generates an error signal if a newly input frequency division ratio differs from the previous frequency division ratio and the already counted value is larger than the new frequency division ratio. Furthermore, the frequency dividing circuit performs forcibly a frequency division completion processing according to the consecutively input frequency signal.

20 Claims, 4 Drawing Sheets

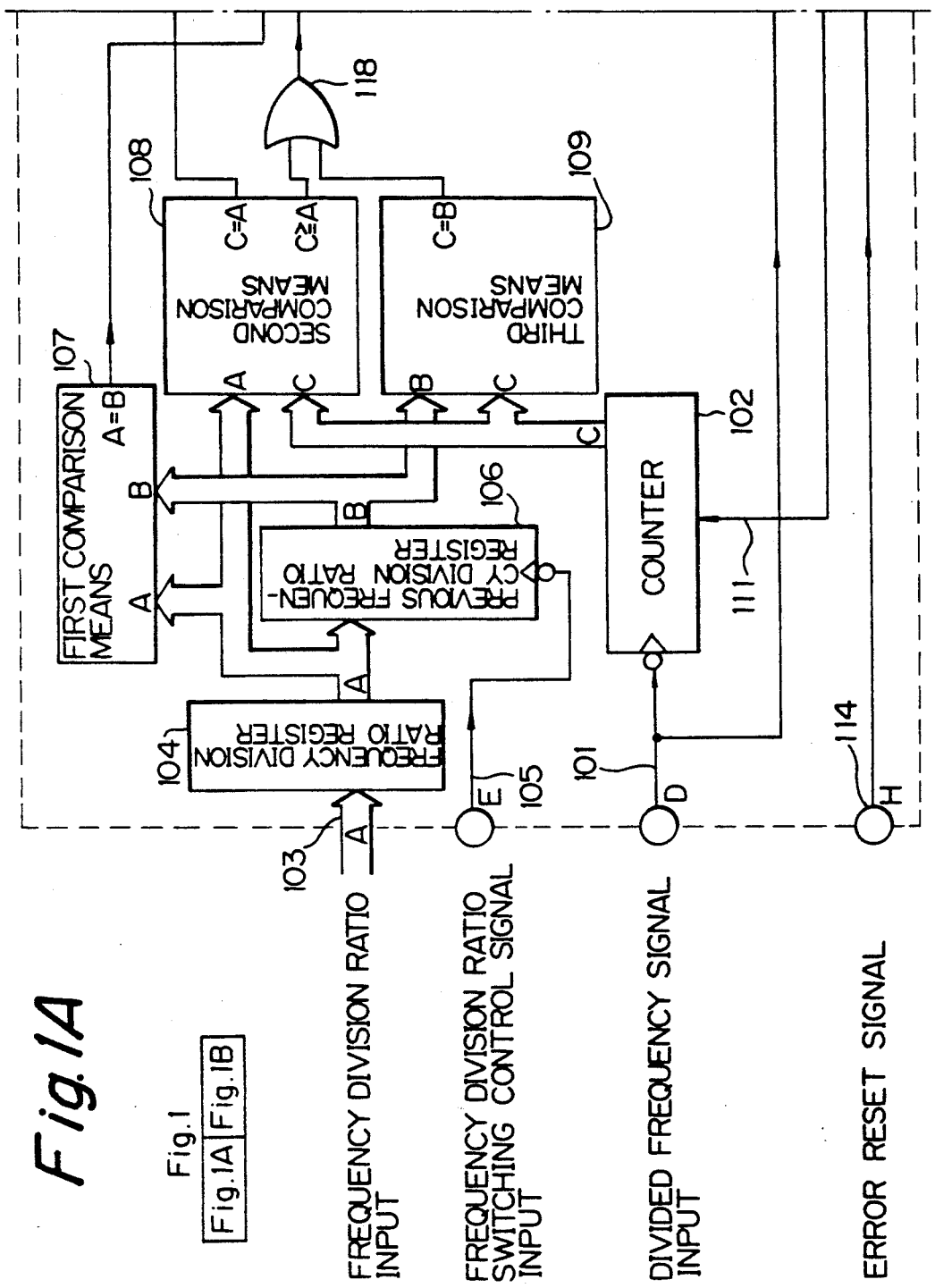

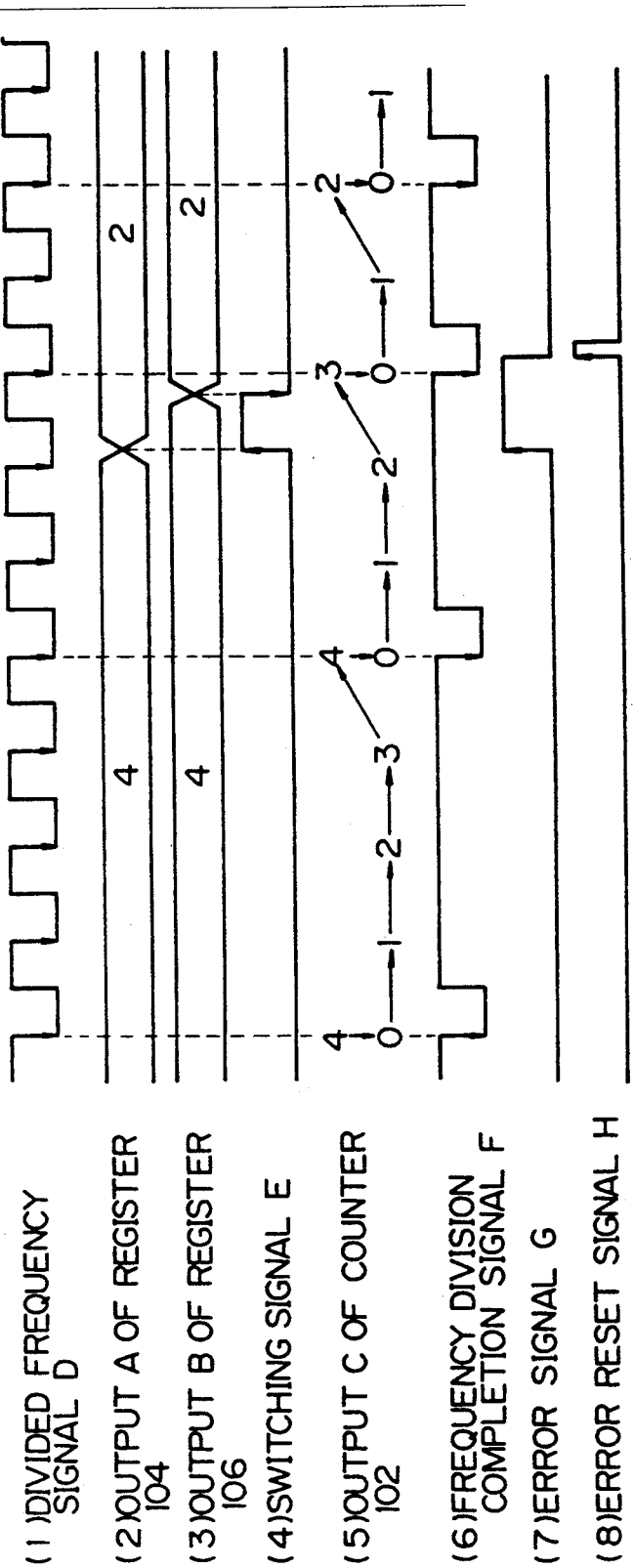

VARIABLE FREQUENCY DIVIDING CIRCUITS

BACKGROUND OF THE INVENTION

This invention relates to a variable frequency dividing circuit, and more particularly to a variable frequency dividing circuit which can switch a frequency dividing ratio with a program. Such a frequency dividing circuit includes a register of which the frequency division ratio can be preset variably with a program data. The frequency dividing circuit of this type, for example, is preferably employed for an engine control circuit.

A conventional frequency dividing circuit includes a counter which counts up (or increments) its output data each time the frequency signal to be divided is input, and outputs a frequency division completion signal when the output value of the counter agrees with a preset frequency dividing ratio value in the frequency dividing operation. In this circuit, if the frequency division ratio is changed by the register and the output value of the counter is larger than the frequency division ratio newly preset, the frequency division completion signal will not be output. As a result, the conventional frequency dividing circuit may possibly generate an error in the frequency dividing operation.

Consequently, in conventional measures the switching operation of a frequency division ratio is held deliberately until the previous frequency dividing operation has been completed. In other words, the preset value is not switched to a new frequency division ratio until the counter in a frequency dividing circuit has been completely reset.

However, the conventional frequency dividing circuit with a stand-by circuit has a disadvantage in that the frequency division operation is delayed, at a maximum, one cycle ranging from a time at which a switching of a frequency division ratio is instructed to a time at which an actual frequency division ratio switching is performed because the frequency dividing ratio is switched simultaneously when the counting operation has been completed.

On the other hand, a method has been employed in which a counter in the frequency dividing circuit is reset in accordance with the switching instruction for a frequency ratio, and the frequency dividing operation is repeated after the frequency division ratio has been switched.

However, this method, in which the counter is forcibly reset, has a disadvantage in that the already counted value is discarded unconditionally, thus resulting in a delay in outputting the frequency division completion signal.

SUMMARY OF THE INVENTION

This invention intends to solve the above mentioned problems, and to provide a frequency dividing circuit that can switch a frequency division ratio without causing any delay in an instructed timing, while performing the frequency dividing operation without discarding the already counted values. Furthermore, an object of this invention is to provide a frequency dividing circuit which notifies an error that has occurred during the frequency division ratio switching, and more immediately and correctly resumes the frequency dividing operation by using the frequency division ratio after switching.

A frequency dividing circuit according to this invention comprising:

a counter for counting each time a divided frequency signal is input;

a first register for storing a frequency division ratio each time the frequency division ratio is input;

a second register for storing the frequency division ratio input into the said first register, according to a frequency division ratio switching signal;

a first comparison means for comparing a value A stored in the first register with value B stored in the second register;

a second comparison means for comparing a value C at the counter with the value A stored in the first register; and means for generating an error signal when a compared result between the first comparison means and the second comparison means $A \neq B$ and $C \geq A$, foor outputting a frequency division completion signal, and for resetting the counter according to the frequency signal.

BRIEF DESCRIPTION OF THE DRAWINGS

FIGS. 1, 1A and 1B are diagrams showing a frequency dividing circuit of this invention;

FIG. 3 is a timing chart showing that an error occurs in a frequency division ratio switching operation.

DETAILED DESCRIPTION OF THE INVENTION

This invention is explained hereinunder with reference to the drawings.

Figure 1B:
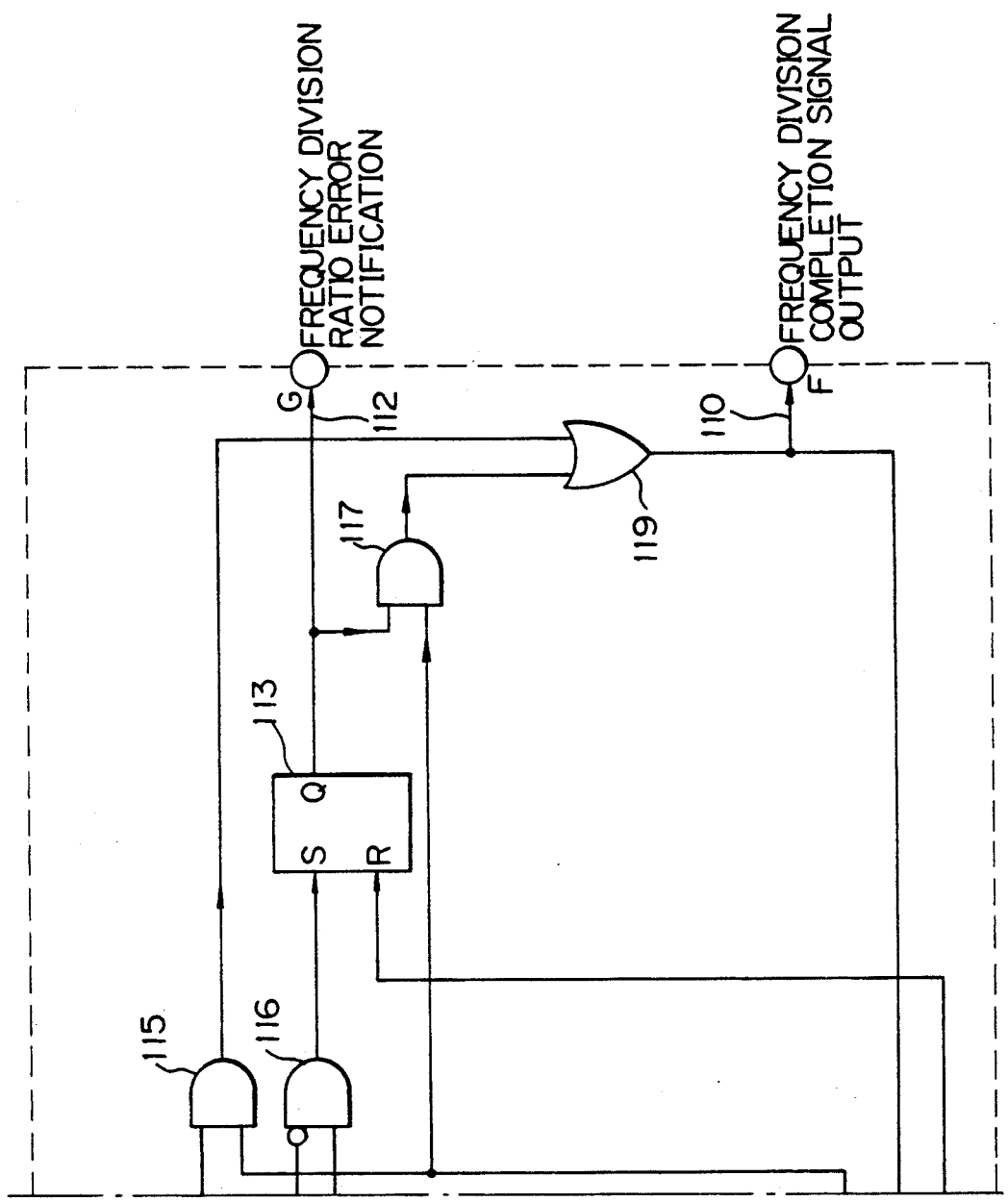

FIG. 1 shows a frequency dividing circuit embodying this invention. The frequency dividing circuit comprises a counter (102), a frequency division ratio register (104), a previous frequency division ratio register (106), a first comparison means (107), a second comparison means (108), a third comparison means (109), and flip-flop (113).

The counter (102) counts up (or increments) each time the frequency singal D which is input into the frequency signal input terminal (101). The frequency division ratio register (104) stores the input frequency ratio data A which is input into a frequency division ratio input part (103). The previous frequency division ratio register (106) retains temporarily a previous frequency division ratio data B during the switching of the frequency division ratio. The register (106) also switches the retained data B to the data A in response to the switching control signal E received through the signal input terminal (105). The first comparison means (107) compares the value A at the frequency division ratio register (104) with the value B at the previous frequency division ratio register (106) and detects the condition that the values are identical to each other. The second comparison means (108) compares the value C at the counter (102) with the value A and detects the condition that the values A and C are identical to each other, or that the value C is larger than the value A. The third comparison means (109) compares the value C with the value B to detect the condition that the values B and C are identical to each other. The flip-flop (113) outputs an error notification signal G to the signal terminal (112) when an error occurs during the frequency division ratio switching operation, and then retains the state of the notification signal G until an error reset singal H is input from a central processing unit (CPU) (not shown) via the terminal (114).

FIG. 1 numerals 115, 116 and 117 are AND gates, and numerals 118 and 119 are OR gates.

In an operation of the frequency dividing circuit, the counter (102) counts up each time the frequency signal D is input into the signal terminal (101). When the second comparision means (108) detects the value A at the frequency division ratio (104), the frequency dividing circuit outputs a frequency division completion signal F from the signal output terminal (110) through the AND gate (115) and the OR gate (119). Furtheremore, the output of the counter (102) is reset to zero in response to the reset singal (111), and then the frequency dividing circuit starts the next frequency dividing operations. These operation are repeated thereafter.

If no new frequency division ratio data is input into the frequency division ratio input part (103), the output from the AND gate (116) is prevented by the output from the first comparison means (107), because the same value as for the frequency divison ratio at the register (104) has already been set in the register (106), thereby allowing no error to occur.

When the frequency division ratio switching control signal E is input into the control singal input terminal (105), and a new value A is written into a frequency division ratio register (104) using the frequency division ratio input means (103), the value at the previous frequency division ratio register (106) is retained as the value B.

When the first comparison means (107) detects that the frequency division ratio A is the same as the ratio B, that is, the same frequency division ratio as the current ratio has been input again, the frequency dividing circuit can prevent an error from outputting via the terminal (112), whereby the current frequency dividing operation continues.

When the first comparison means (107) detects that the frequency division ratio A is not the same as the ratio B, that is, a frequency division ratio different from the current preset ratio is input, an output from the AND gate (116) becomes possible, whereby the frequency dividing circuit performs the following operations:

The second comparison means (108) compares the value C at the counter (102) at that time with the value A at the frequency division ratio register (104). The third comparison means (109) also compares the value C at the counter (102) with value B at the previous frequency division ratio register (106), and if $$C < A \text{ and } C \neq B,$$

no error singal is generated.

In other words, this refers to a case in which the switching of a frequency division ratio has been carried out without any problem, and a frequency dividing operation takes place using the value A at the frequency division ratio register (104), successively from the condition of the value C at the counter (102). After the frequency division switching control sigal E has been completely input, the value A of the frequency division ratio register (104) is set in the previous frequency divison ratio register (106), and the frequency division ratio switching operation is completed.

Figure 2:
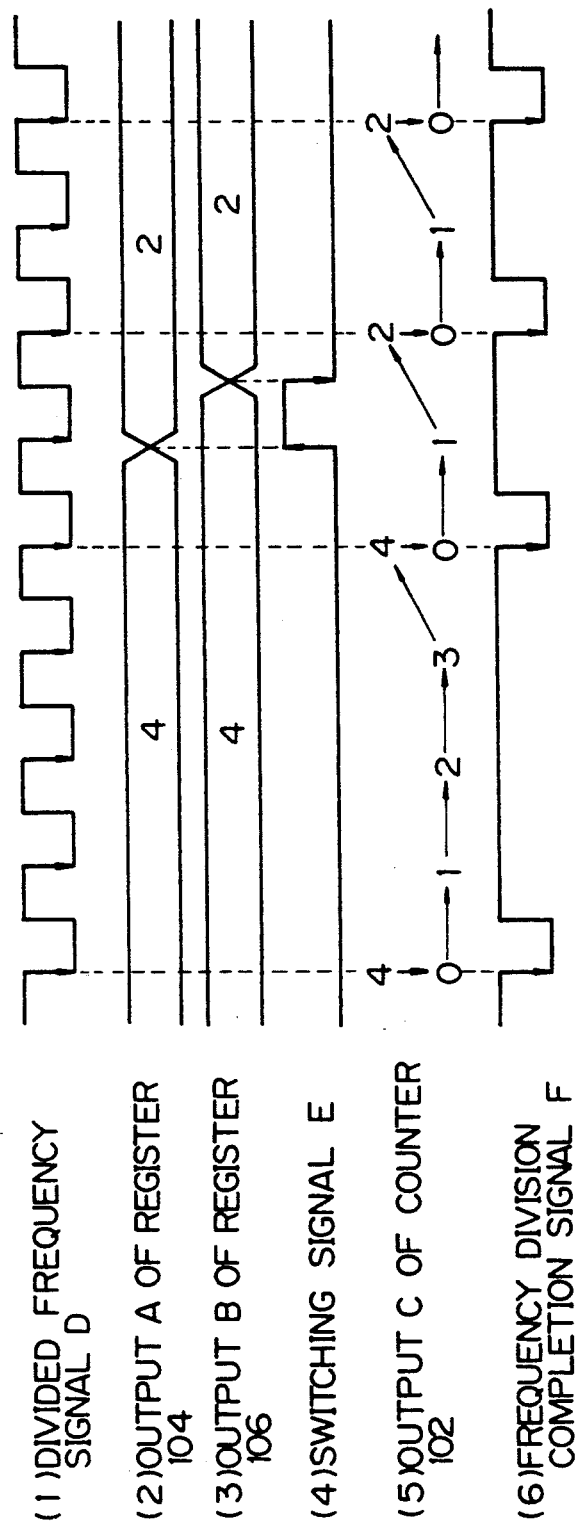
FIG. 2 is a timing chart showing that no error occurs in frequency division ratio switching operation.

FIG. 2 is a timing chart providing an example in which this frequency division ratio switching has been carried out without any problem.

Each time the frequency singal D (FIG. 2 (1)) is input, the value C at the counter (102) (FIG. 2 (5)) will be counted up. If the value C of the counter (102) reaches 4 when the value A at the frequency division ratio register (104) (FIG. 2 (2)) is 4, the frequency division completion signal F (FIG. 2 (6)) is output. When a frequency division ratio 2 is input into the frequency division ratio register (104) the value A at the frequency division ratio register (104) is changed from 4 to 2. At this time, the value B of the previous frequency division ratio register (106) (FIG. 2 (3)) is retained to a frequency division ratio of 4 until the input of the frequency division ratio switching signal E (FIG. 2 (4)) has been finished. In this condition where the value A at the frequency division ratio register (104) differs from the value B at the previous frequency division ratio register (106), the value C at the counter (102) is 1, therefore the condition $$C < A \text{ and } C \neq B$$

is satisfied, and no error occurs in the frequency dividing circuit. Therefore, when the next frequency signal D will be input and the value C at the counter (102) has been counted up to 2, the frequency division completion signal F will be output, and the value C at the counter (102) has been reset to zero.

On the other hand, if $$C \geq A \text{ or } C = B$$

is completed as a result of comparison at the second comparison means (108) and the third comparison means (109), the error signal G is output from the terminal (112) through the OR gate (118), AND gate (116) and the flip-flop (113). The output from the flip-flop (113) will be held as it is until the error reset signal H is input from a control means, such as a central processing unit (CPU) (not shown) through the error reset signal terminal (114). When a next frequency signal D is input from the divided frequency signal input terminal (101), the AND gate (117) opens, whereby the frequency division completion signal F is output from the output terminal (110).

Furthermore, the value C at the counter (102) is reset to zero as a function of the counter reset signal (111). Thereafter, this frequency dividing circuit carries out the frequency dividing operation according to the value A at the frequency division ratio register (104).

FIG. 3 shows a timing chart providing an example where an error signal is generated. When the value A at the frequency division ratio register (104) (FIG. 3 (2)) changes from 4 to 2 and the value B at the previous frequency division ratio register (106) is still retained at 4, the value C at the counter (102) (FIG. 3 (5)) is 2.

Consequently, because C=A, the error signal G (FIG. 3 (7)) is generated. When the next frequency signal D (FIG. 3 (1)) is successively input, the frequency division completion signal F (FIG. 3 (6)) is output, and at the same time, the value C at the counter (102) is reset to zero. The error signal G is then released as a function of the error reset signal H (FIG. 3 (8)).

An explanation has been given heretofore for the case in which the counter (102) in the frequency dividing circuit begins to count up. It is apparent that one objective of the present invention can be realized by simply adding a means for setting the value deducted from the counter value if there is no problem in switching the frequency division ratio even in case where the counter in the frequency dividing circuit counts down, by means of reversing the size relationship between the counter value and the value at the frequency division ratio register after switching, or by means of charging the reset value to the counter from zero to the value in the frequency division ratio register.

I claim:

1. A variable frequency dividing circuit comprising:
   a counter coupled to count cycles of an input signal;
   a first register for storing a frequency division ratio as a value A each time the frequency division ratio is input and outputting the value A;
   a second register coupled to the first register for storing the value A from the first register as a value B and outputting the value B;
   a first comparison circuit coupled to the first and second registers for comparing the value A with the value B;
   a second comparison circuit coupled to the first register and the counter for comparing a value C output from the counter with the value A;
   an error circuit coupled to the first and second comparison circuits for generating an error signal when the compared results of the first comparison circuit and second comparison circuit are $A \neq B$ and $C \geq A$; and
   a circuit coupled to the error circuit for outputting a frequency division completion signal as a reset signal to the counter responsive to the error signal.

2. A variable frequency dividing circuit as claimed in claim 1 further comprising:
   a third comparison circuit coupled to the second register and the counter for comparing the value C with the value B; and
   a further error circuit for generating the error signal when the compared results of the first comparison circuit and the third comparison circuit are $A \neq B$ and $C = B$, wherein the completion signal output circuit outputs the frequency division completion signal and sends the reset signal to the counter responsive to the error signal.

3. A variable frequency dividing circuit as claimed in claim 1, wherein the second register retains the previously stored frequency division ratio for a predetermined period of time after the frequency division ratio has been input into the first register, and then switches the frequency division ratio according to the switching signal.

4. A variable frequency dividing circuit as claimed in claim 1, wherein the error signal is reset according to an error reset signal.

5. A variable frequency divider circuit comprising:
   memory providing first and second storage locations for storing first and second data (A,B) which indicate a frequency division ratio;
   a counting circuit for receiving a frequency signal and providing data C which indicates a counted value;
   an input coupled to said memory for receiving the frequency division ratio and coupling it to said first storage location;
   first means for writing the frequency division ratio from the input into the first storage location as data (A);
   second means for writing data (a) from the first storage location into the second storage location as data (B);
   comparison circuitry providing a first compared result of data A and data B and further providing a second compared result of data A and data C; and
   error circuitry coupled to the comparison circuitry for receiving the first and second compared results from said comparison circuitry and generating an error signal when the first and second compared results meet a first preselected condition.

6. The circuit of claim 5 wherein said first preselected condition is defined as $A \neq B$ and $C \geq A$.

7. The circuit of claim 5 wherein said memory comprises a fist register and a second register and wherein said first means comprises a connection from said first register to said second register.

8. The circuit of claim 7 wherein said comparison circuitry comprises first and second comparison circuits, the first comparison circuit being coupled to the first and second registers, and the second comparison circuit being coupled to the first register and the counter.

9. The circuit of claim 8 wherein said comparison circuitry further comprises a third comparison circuit coupled to the second register and the counter.

10. The circuit of claim 5 wherein said comparison circuitry further provides a third compared result of the data B and the data C.

11. The circuit of claim 10 wherein said error circuitry generates the error signal when the first and third compared results meet a second preselected condition.

12. The circuit of claim 11 wherein said second preselected condition defined as $A \neq B$ and $B = C$.

13. The circuit according to claim 5 wherein said memory is coupled to receive a switching signal for switching the frequency division ratio.

14. The circuit according to claim 7 wherein said second register is coupled to receive a switching signal for switching the frequency division ratio.

15. A variable frequency divider circuit according to claim 5:
   wherein said first preselected condition is defined as $A \neq B$ and $C \geq A$;
   wherein said memory comprises a first register and a second register;
   wherein said first means comprises a connection from said first register to said second register;
   wherein said comparison circuitry comprises first, second and third comparison circuits, the first comparison being circuit coupled to the first and second registers, the second comparison circuit being coupled to the first register and the counter, and the third comparison circuit being coupled to the second register and the counter;
   wherein said comparison circuitry further provides a third compared result of data B and data C; and
   wherein said error circuitry generates the error signal when the first and third compared results meet a second preselected condition.

16. A method for varying the divisor used in a frequency divider circuit comprising the steps of:
   receiving a frequency division ratio and storing it at a first storage location as data (A);
   writing data (A) from said first storage location into a second storage location as data (B) according to a switching signal;
   receiving an oscillating input, counting cycles thereof at a counter and providing counter output data (C); and comparing data (A) to data (B) and data (C), respectively, and data (B) to data (C); and generating an error signal when the relationships of data A, data B and data C are a preselected condition between data A and data B, between data C and data A or B.

17. The method of claim 16 further comprising the step of temporarily retaining previous data (A) in said second storage location as data (B) after said frequency division ratio is received at said first storage location.

18. The method of claim 16 further comprising the step of generating a reset signal to reset the counter when the frequency signal has been consecutively input after generating an error signal.

19. The method of claim 16 further comprising the step of providing a frequency division completion signal when the frequency signal has been consecutively input after generating an error signal.

20. The method of claim 16 wherein said preselected condition is data A$\neq$data B and data C$\geq$data A, or data A$\neq$data B and data C=data B.

* * * * *